United States Patent
Park

(10) Patent No.: US 9,881,988 B2
(45) Date of Patent: Jan. 30, 2018

(54) FLEXIBLE DISPLAY

(71) Applicant: Samsung Display Co., Ltd., Yongin-si, Gyeonggi-do (KR)

(72) Inventor: Sun Park, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/204,908

(22) Filed: Jul. 7, 2016

(65) Prior Publication Data

US 2017/0077208 A1 Mar. 16, 2017

(30) Foreign Application Priority Data

Sep. 15, 2015 (KR) ........................ 10-2015-0130598

(51) Int. Cl.
*H01L 27/32* (2006.01)

(52) U.S. Cl.
CPC ...... *H01L 27/3276* (2013.01); *H01L 27/3262* (2013.01); *H01L 2227/323* (2013.01); *H01L 2251/5338* (2013.01)

(58) Field of Classification Search
CPC . H01L 27/32; H01L 27/3276; H01L 32/3262; H01L 51/0097; H01L 2/3262; H01L 51/00977
See application file for complete search history.

(56) References Cited

U.S. PATENT DOCUMENTS

| | | | |
|---|---|---|---|
| 8,461,760 B1 | 6/2013 | Oh et al. | |
| 2012/0050235 A1* | 3/2012 | Park | H01L 27/3276 345/204 |
| 2014/0183472 A1* | 7/2014 | Kim | H01L 27/3258 257/40 |
| 2014/0184579 A1* | 7/2014 | Kim | G09G 3/3208 345/212 |
| 2014/0306941 A1 | 10/2014 | Kim et al. | |
| 2014/0354558 A1 | 12/2014 | Cho et al. | |
| 2015/0060778 A1* | 3/2015 | Kim | H01L 27/3258 257/40 |
| 2015/0144952 A1* | 5/2015 | Kim | H01L 27/3262 257/72 |
| 2015/0221705 A1* | 8/2015 | Amano | H01L 27/3223 257/72 |
| 2016/0013436 A1* | 1/2016 | Im | H01L 51/5206 257/40 |
| 2016/0188083 A1* | 6/2016 | Shi | G06F 3/044 345/174 |

FOREIGN PATENT DOCUMENTS

| | | | |
|---|---|---|---|
| KR | 10-2014-0122960 A | 10/2014 | |
| KR | 10-2014-0141380 A | 12/2014 | |
| KR | 10-2015-0031844 A | 3/2015 | |

* cited by examiner

*Primary Examiner* — Phuc Dang
(74) *Attorney, Agent, or Firm* — Knobbe, Martens, Olson & Bear, LLP

(57) ABSTRACT

A flexible display is disclosed. In one aspect, the flexible display includes a substrate, a gate insulating layer formed over the substrate, an interlayer insulating layer formed over the gate insulating layer, and a trench disposed between the gate and interlayer insulating layers and configured to accommodate a signal line therein.

19 Claims, 9 Drawing Sheets

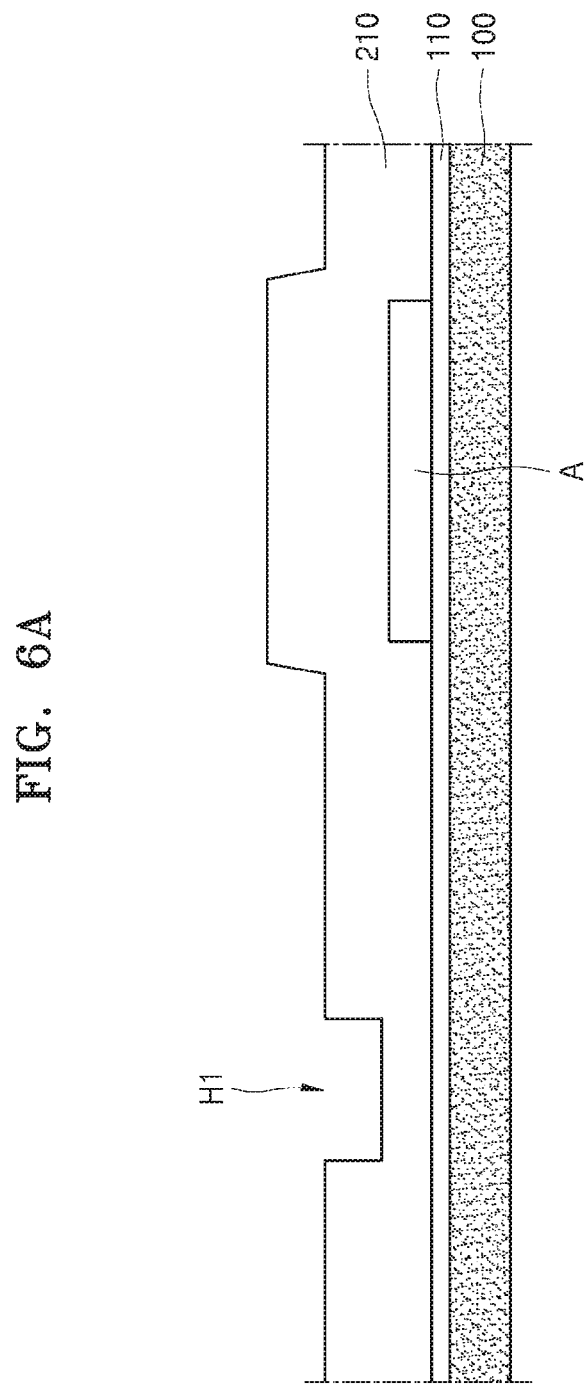

FLEXIBLE DISPLAY

CROSS-REFERENCE TO RELATED APPLICATION

This application claims the benefit of Korean Patent Application No. 10-2015-0130598, filed on Sep. 15, 2015, in the Korean Intellectual Property Office, the disclosure of which is incorporated herein in its entirety by reference.

BACKGROUND

Field

The described technology generally relates to a flexible display.

Description of the Related Technology

With the development of information technology, the market demand of display devices which connect users to information has greatly expanded. Accordingly, a flat panel display (FPD) such as a liquid crystal display (LCD), an organic light-emitting diode (OLED) display, a plasma display panel (PDP) has come into wide use.

If a display device is flexible, a user may fold or roll the display device to carry the display device. Thus, a screen of the display device may expand and portability thereof may increase.

Therefore, research into commercialization of display devices including flexible display panels has been recently reinforced.

SUMMARY OF CERTAIN INVENTIVE ASPECTS

One inventive aspect relates to a flexible display and a method of manufacturing the same.

Another aspect is a flexible display device that includes: a substrate; a gate insulating layer formed on the substrate; and an interlayer insulating layer formed on the gate insulating layer. A line insertion part is formed on at least one insulating layer disposed between the gate insulating layer and the interlayer insulating layer.

The line insertion part may extend in a lengthwise direction (y) of a line.

The line insertion part may have a certain thickness that is less than a thickness of the gate insulating layer or the interlayer insulating layer in a thickness direction (z) of the gate insulating layer or the interlayer insulating layer.

The line insertion part may be shaped as a rectangular parallelepiped having a height in a lengthwise direction (y) of a line, a vertical length of a base side in a thickness direction (z) of the gate insulating layer or the interlayer insulating layer, and a horizontal length of the base side in a direction (x) perpendicular to the vertical length.

The flexible display device may further include a thin film transistor including a gate electrode formed on the gate insulating layer and a source electrode and the drain electrode formed on the interlayer insulating layer. The thin film transistor may be formed on the substrate, and an organic light-emitting device (OLED) may be formed on the thin film transistor.

A first line insertion part may be formed in the gate insulating layer, and a gate line may be formed on the same layer as the gate electrode and may be inserted into the first line insertion part.

The gate line may include a plurality of scan lines, a plurality of emission control lines, and an initial voltage line.

A second line unit may be formed in the interlayer insulating layer, and a data line may be formed on the same layer as the source and drain electrodes and may be inserted into the second line unit.

The data line may include a driving voltage line.

Cracks generated in end portions the flexible display device due to external impact may pass within the gate insulating layer or the interlayer insulating layer and may be blocked by a line insertion hole.

The wire insertion part may be shaped as a rectangular parallelepiped having a protrusion protruding on a base side of the wire insertion part in a vertical direction.

The wire inserted into the wire insertion part may have a groove on a base side of the wire, the groove interlocking with the protrusion.

Another aspect is a method of manufacturing a flexible display device that includes: forming a gate insulating layer on a substrate; forming a first wire insertion part on the gate insulating layer; forming a gate electrode on the gate insulating layer and inserting a gate wire into the first wire insertion part; and forming an interlayer insulating layer on the gate wire and the gate electrode.

The method may further include forming a second wire insertion part, a source electrode contact hole, and a drain electrode contact hole in the interlayer insulating layer after the interlayer insulating layer is formed.

The method may further include forming a source electrode and a drain electrode on the interlayer insulating layer and inserting a data wire into the second wire insertion part after the second wire insertion part, the source electrode contact hole, and the drain electrode contact hole are formed.

Another aspect is a flexible display comprising: a substrate; a gate insulating layer formed over the substrate; an interlayer insulating layer formed over the gate insulating layer; and a trench disposed between the gate and interlayer insulating layers and configured to accommodate a signal line therein.

In the above flexible display, the trench extends in a lengthwise direction of a gate line or a data line.

In the above flexible display, the trench has a thickness less than that of the gate insulating layer or the interlayer insulating layer in a thickness direction of the gate insulating layer or the interlayer insulating layer.

In the above flexible display, the trench has a rectangular parallelepiped shape having a height in a lengthwise direction of a gate line or data line, a vertical length of a base side in a thickness direction of the gate insulating layer or the interlayer insulating layer, and a horizontal length of the base side in a widthwise direction crossing the lengthwise direction.

The above flexible display further comprises: a thin film transistor (TFT) comprising a gate electrode formed over the gate insulating layer and source and drain electrodes formed over the interlayer insulating layer, wherein the TFT is formed over the substrate; and an organic light-emitting device (OLED) formed over the TFT.

In the above flexible display, the trench comprises a first trench formed in the gate insulating layer, wherein the flexible display further comprises a gate line formed on the same layer as the gate electrode and inserted into the first trench.

In the above flexible display, the gate line comprises a plurality of scan lines, a plurality of emission control lines, and an initial voltage line.

In the above flexible display, the trench comprises a second trench formed in the interlayer insulating layer, wherein the flexible display further comprises a data line formed on the same layer as the source and drain electrodes and inserted into the trench.

In the above flexible display, the data line comprises a driving voltage line.

In the above flexible display, the trench is configured to block a plurality of cracks, generated in end portions the flexible display due to external impact, from propagating beyond the gate insulating layer or the interlayer insulating layer.

In the above flexible display, the trench has a rectangular parallelepiped shape and has a protrusion protruding towards a gate line or a data line.

In the above flexible display, the data line or gate line inserted into the trench has a groove on a base side of the data line or gate line, wherein the groove interlocks with the protrusion.

In the above flexible display, the protrusion has a rectangular shape.

In the above flexible display, the protrusion has a triangular shape.

Another aspect is a method of manufacturing a flexible display, the method comprising: forming a gate insulating layer over a substrate; forming a first trench over the gate insulating layer; forming a gate electrode over the gate insulating layer; inserting a gate line into the first trench; and forming an interlayer insulating layer over the gate line and the gate electrode.

The above method further comprises forming a second trench, a source electrode contact hole, and a drain electrode contact hole in the interlayer insulating layer after the interlayer insulating layer is formed.

The above method further comprises forming a source electrode and a drain electrode over the interlayer insulating layer and inserting a data line into the second trench after the second trench, the source electrode contact hole, and the drain electrode contact hole are formed.

Another aspect is A flexible display comprising: a substrate; a gate insulating layer formed over the substrate and having a first trench formed therein; and a line disposed in the first trench.

The above flexible display further comprises an interlayer insulating layer formed over the gate insulating layer and a line, wherein the interlayer insulating layer has a second trench formed therein.

In the above flexible display, the first and second trenches each has a protrusion respectively protruding towards the shapes accommodating the respective protrusion.

BRIEF DESCRIPTION OF THE DRAWINGS

FIGS. 6A, 6B and 6C are cross-sectional views sequentially illustrating a method of manufacturing a flexible display device, according to an exemplary embodiment.

DETAILED DESCRIPTION OF CERTAIN INVENTIVE EMBODIMENTS

Figure 1:
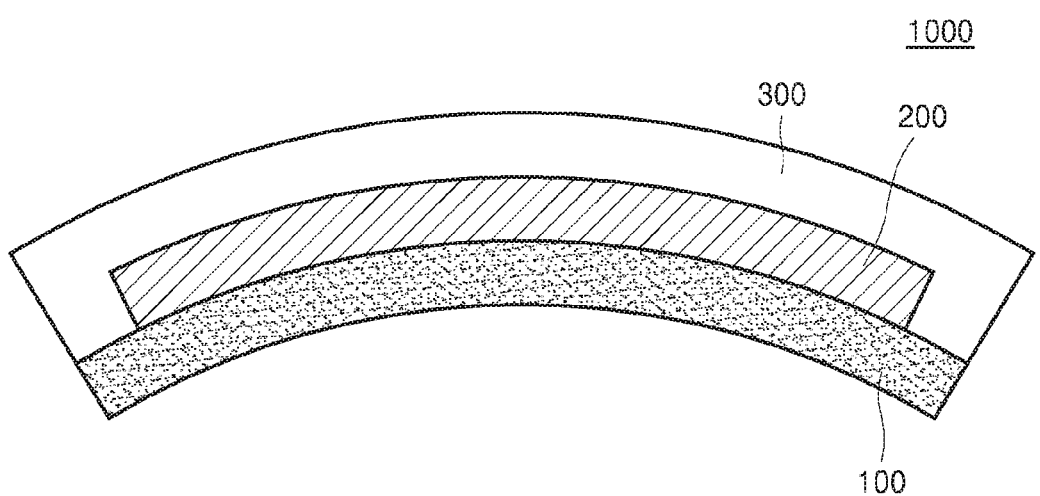
FIG. 1 is a schematic cross-sectional view of a flexible display device.

As the described technology allows for various changes and numerous exemplary embodiments, particular exemplary embodiments will be illustrated in the drawings and described in detail in the written description. However, this is not intended to limit the described technology to particular modes of practice, and it is to be appreciated that all changes, equivalents, and substitutes that do not depart from the spirit and technical scope of the described technology. In the description of the described technology, certain detailed explanations of the related art are omitted when it is deemed that they may unnecessarily obscure the essence of the described technology. Like reference numerals in the drawings denote like elements.

While such terms as "first", "second", etc., may be used to describe various components, such components must not be limited to the above terms. The above terms are used only to distinguish one component from another.

The terms used in the present specification are merely used to describe particular exemplary embodiments, and are not intended to limit the described technology. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, the described technology will be described in detail by explaining exemplary embodiments with reference to the attached drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
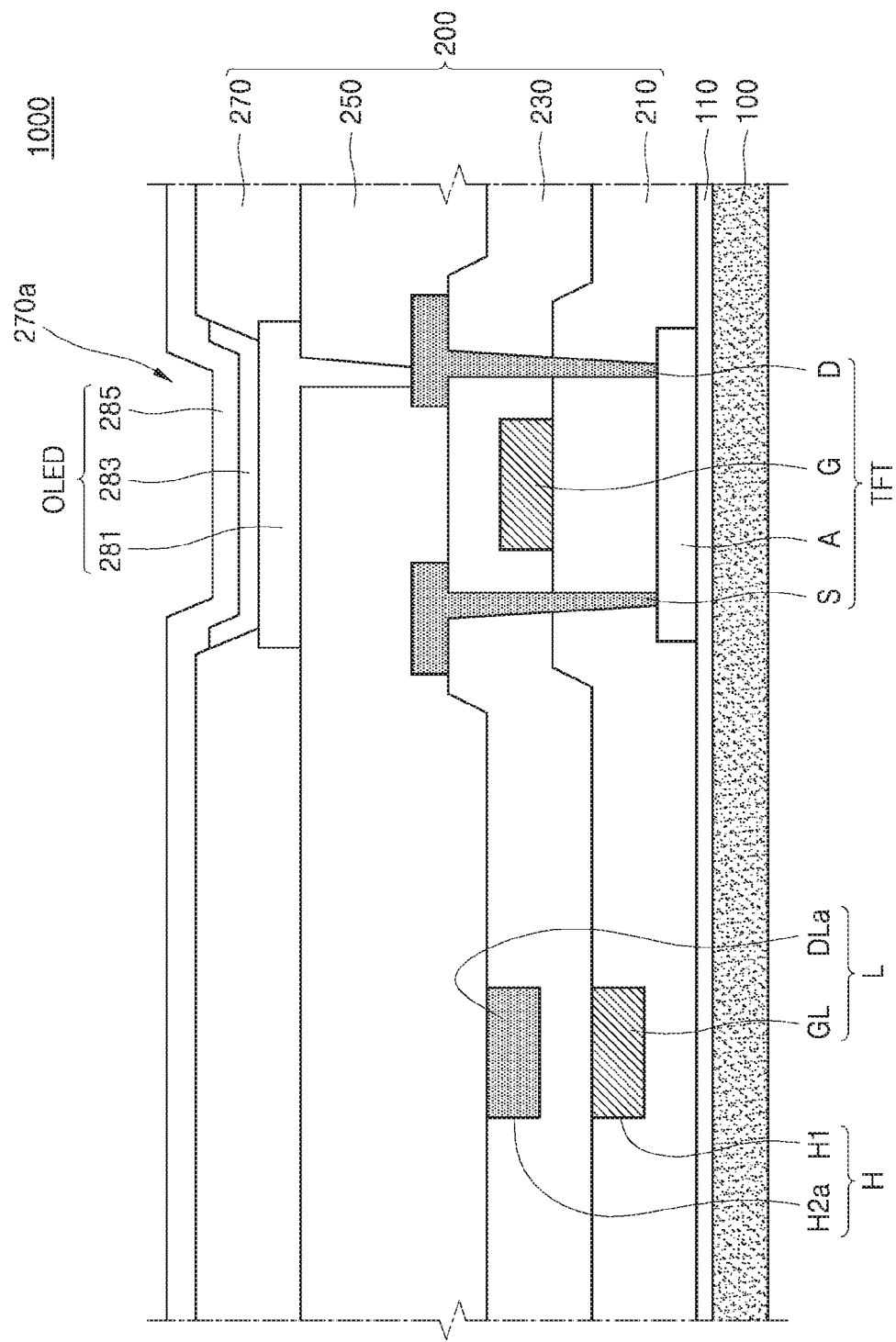
FIG. 2 is a schematic cross-sectional view of an enlarged portion of a display unit of FIG. 1.

FIG. 1 is a schematic cross-sectional view of a flexible display device 1000. FIG. 2 is a schematic cross-sectional view of an enlarged portion of a display unit 200 of FIG. 1.

The flexible display device 1000 may include a substrate 100, the display unit 200 on the substrate 100, and a thin film encapsulation layer 300 disposed on the display unit 200 and sealing the same.

The substrate 100 may include various materials. For example, the substrate 100 is formed of a glass material, other insulating materials, or a metallic thin film.

As a selective exemplary embodiment, the substrate 100 is formed of a flexible material. For example, the substrate 100 is formed of an organic material.

As another selective exemplary embodiment, the substrate 100 is formed of at least one of a silicone-based polymer, polyurethane, polyurethane acrylate, an acrylate polymer, and an acrylate terpolymer. The silicone-based polymer may include, for example, polydimethylsiloxane (PDMS) and hexamethyldisiloxane (HMDSO).

As shown in FIG. 1, the flexible display device 1000 may be two-dimensionally bent because the substrate 100 is flexible. FIG. 1 shows a structure in which the substrate 100 is bent in an upward direction, but a direction in which the substrate 100 is bent is not limited thereto. The substrate 100 may be bent in a downward direction, that is, a direction in which the display unit 200 is formed.

As a selective exemplary embodiment, the substrate 100 may include a material having a Poisson's ratio of about 0.4 or above. The Poisson's ratio is a ratio for both when a length of a material increases because the material is pulled and stretched in one direction and a length of the material decreases in another direction. Since the material forming the substrate 100 has the Poisson's ratio of about 0.4 or above, that is, has a property that allows the substrate 100 to be well stretched, the flexibility of the substrate 100 is improved, and the substrate 100 may have a bending area. Thus, the flexible display device 1000 may easily include the bending area.

The display unit 200 may be formed on the substrate 100. The display unit 200 generates visible rays that a user may view. The display unit 200 may include various devices, for example, an organic light-emitting device (OLED) or a liquid crystal display (LCD) device.

The thin film encapsulation layer 300 may be formed on the display unit 200 to protect the same from external moisture and oxygen.

As a selective exemplary embodiment, the thin film encapsulation layer 300 may be formed on the display unit 200, and both ends of the thin film encapsulation layer 300 may adhere to the substrate 100.

As a selective exemplary embodiment, the thin film encapsulation layer 300 has a structure in which thin film layers are stacked and may have a structure in which inorganic layers and organic layers are alternately stacked. The structure of the thin film encapsulation layer 300 is not limited thereto and may have any structure as long as the structure is designed to protect the display unit 200 from external moisture or oxygen.

FIG. 2 is a schematic cross-sectional view of enlarged portions of the substrate 100 and the display unit 200 formed on the substrate 100. Hereinafter, a structure of the display unit 200 is described in detail with reference to FIG. 2.

In the flexible display device 1000, the display unit 200 may include an OLED.

A buffer layer 110 may be formed on the substrate 100. The buffer layer 110 may prevent dispersion of impurity ions and penetration of external moisture and oxygen and may function as a barrier layer and/or a blocking layer for flattening a surface of the substrate 100.

A thin film transistor TFT may be formed on the buffer layer 110. An active layer A of the thin film transistor TFT may be formed of a polysilicon and may include a channel area that is not doped with impurities and source and drain areas that are formed by doping both sides of the channel area with impurities. The impurities may differ depending on types of thin film transistors and may be of an N type or a P type.

After the active layer A is formed, a gate insulating layer 210 may be formed on the active layer A and also on the entire substrate 100. The gate insulating layer 210 may include a single layer or multiple layers formed of an inorganic material such as silicon oxide ($SiO_2$) or silicon nitride ($SiN_x$). The gate insulating layer 210 may insulate the active layer A and a gate electrode G, which is formed on the gate insulating layer 210, from each other.

After the gate insulating layer 210 is formed, the gate electrode G may be formed on the gate insulating layer 210. The gate electrode G may be formed through photolithography and etching.

The gate electrode G may be formed of one or more metallic materials selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

After the gate electrode G is formed, an interlayer insulating layer 230 may be formed on the entire substrate 100.

The interlayer insulating layer 230 may be formed of an inorganic material. For example, the interlayer insulating layer 230 is formed of a metal oxide or a metal nitride such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZrO_2$), and the like.

The interlayer insulating layer 230 may include a single layer or layers formed of an inorganic material such as SiOx and/or SiNx. In some exemplary embodiments, the interlayer insulating layer 230 may have a double structure including SiOx/SiNy or $SiN_x$/SiOy.

A source electrode S and a drain electrode D of the thin film transistor TFT may be arranged on the interlayer insulating layer 230.

The source electrode S and drain electrode D may each be formed of one or more metallic materials selected from the group consisting of Al, Pt, Pd, Ag, Mg, Au, Ni, Nd, Ir, Cr, Li, Ca, Mo, Ti, W, and Cu.

A line insertion part or line insertion trench H may be formed on the gate insulating layer 210 or the interlayer insulating layer 230. The line insertion part H may be formed to have a certain thickness in a downward direction from an upper surface of the gate insulating layer 210 or the interlayer insulating layer 230.

In the flexible display device 1000, a line L is not formed on the gate insulating layer 210 or the interlayer insulating layer 230, but may be inserted into the line insertion part H.

As a selective exemplary embodiment, a first line insertion part H1 may be formed in the gate insulating layer 210 of the flexible display device 1000, and a second line insertion part H2a may be formed in the interlayer insulating layer 230.

The first line insertion part H1 may be formed in the gate insulating layer 210 of the flexible display device 1000, and the second line insertion part H2a may be formed in the interlayer insulating layer 230.

As shown in FIG. 2, the line insertion part H is formed in each of the gate insulating layer 210 and the interlayer insulating layer 230 of the flexible display device 1000, but is not limited thereto.

As a selective exemplary embodiment, the first line insertion part H1 is formed in the gate insulating layer 210 of the flexible display device 1000, but the second line insertion part H2a may not be formed in the interlayer insulating layer 230.

As another selective exemplary embodiment, the second line insertion part H2a may be formed in the interlayer insulating layer 230, but the first line insertion part H1 may not be formed in the gate insulating layer 210 of the flexible display device 1000.

As the line insertion part H is formed in the gate insulating layer 210 or the interlayer insulating layer 230, cracks propagating in the gate insulating layer 210 or the interlayer insulating layer 230 may be blocked.

That is, as glass is removed during the manufacture of the flexible display device 1000, cracks may be easily generated in end portions of the flexible display device 1000 due to small external impact, and the cracks that are generated in the end portions propagate within the flexible display device 1000 and may reach an area where the OLED is formed. In this case, the OLED may have reliability problems.

Accordingly, as a selective exemplary embodiment, the line insertion part H is formed in at least one upper surface of the gate insulating layer 210 or the interlayer insulating layer 230, and as the line insertion part H is formed, cracks passing through the insulating layer are blocked by the line insertion part H, thereby improving the reliability of the flexible display device 1000.

In the flexible display device 1000, the line insertion part H having a substantially uniform thickness may be formed in the upper surfaces of the gate insulating layer 210 and the interlayer insulating layer 230 in a downward direction. In this case, the propagation of the cracks may be effectively blocked.

FIG. 2 only shows a cross-section of the display unit 200, and thus, a shape of the line insertion part H is described below.

A via layer 250 is formed on the entire substrate 100 and covers the source electrode S and the drain electrode D. A pixel electrode 281 may be formed on the via layer 250. According to the exemplary embodiment of FIG. 2, the pixel electrode 281 is connected to the drain electrode D through a via hole.

The via layer 250 may be formed of insulating materials. For example, the via layer 250 is a single layer or layers including an inorganic material, an organic material, and/or an organic/inorganic composite and may be formed through various deposition methods. In some exemplary embodiments, a planarization layer PL is formed of at least one material selected from the group consisting of polyacrylate resin, epoxy resin, phenolic resin, polyamide resin, polyimide resin, unsaturated polyester resin, poly phenylene ether resin, poly phenylene sulfide resin, and benzocyclobutene (BCB).

The OLED may be formed on the via layer 250. The OLED may include the pixel electrode 281, an intermediate layer 283 including an organic light-emitting layer, and an opposite electrode 285. Also, the OLED may further include a pixel-defining layer 270.

The pixel electrode 281 and/or the opposite electrode 285 may be a transparent electrode or a reflective electrode. The pixel electrode 281 and/or the opposite electrode 285 that is a transparent electrode may include ITO, IZO, ZnO, or $In_2O_3$. The pixel electrode 281 and/or the opposite electrode 285 as a reflective electrode may include a reflective film formed of Ag, Mg, Al, Pt, Pd, Au, Ni, Nd, Ir, Cr, a composite thereof, or the like and a transparent film formed of ITO, IZO, ZnO, or $In_2O_3$. In some exemplary embodiments, the pixel electrode 281 or the opposite electrode 285 has an ITO/Ag/ITO structure.

The intermediate layer 283 is formed between the pixel electrode 281 and the opposite electrode 285 and may include the organic light-emitting layer.

As a selective exemplary embodiment, the intermediate layer 283 includes the organic light-emitting layer and may further include at least one of a hole injection layer (HIL), a hole transport layer (HTL), an electron transport layer (ETL), and an electron injection layer (EIL). However, the present exemplary embodiment is not limited thereto, and the intermediate layer 283 includes the organic light-emitting layer and may further include one or more functional layers.

The pixel-defining layer 270 may define a pixel area and a non-pixel area. The pixel-defining layer 270 includes an opening exposing the pixel electrode 281 and may cover the entire substrate 100. The intermediate layer 283 to be described below is formed in the opening 270a, and the opening 270a may be an actual pixel area.

A line, which is inserted into the first line insertion part H1 formed in the gate insulating layer 210, may be a gate line GL formed on the same layer as the gate electrode G.

The gate line GL is not limited to a certain line and may include any line, for example, scanning lines, emission control lines, or the like, as long as the line is formed on the same layer as the gate electrode G and is connected to the gate electrode G.

The gate line GL may be formed simultaneously with the gate electrode G and may be formed of the same material as the gate electrode G. As a selective exemplary embodiment, the gate line GL is formed of one or more metallic materials selected from the group consisting of Mo, Al, Pt, Pd, Ag, Mg, Au, Ni, Nd, Ir, Cr, Li, Ca, Ti, W, and Cu.

The gate electrode G is formed on the gate insulating layer 210, as shown in FIG. 2, but the gate line GL of the flexible display device 1000 according to the present exemplary embodiment does not protrude from the upper surface of the gate insulating layer 210 and may inserted into the gate insulating layer 210.

That is, the gate line GL may be inserted into the first line insertion hole H1 formed in a downward direction from the upper surface of the gate insulating layer 210. Accordingly, the propagation of cracks through the gate insulating layer 210 may be prevented.

As a selective exemplary embodiment, the second line insertion part H2a is formed in the interlayer insulating layer 230, and a line inserted into the second line insertion part H2a may be a data line DLa that is formed on the same layer as the source electrode S and the drain electrode D.

The data line DLa is not limited to a certain line and may include any line as long as the line, for example, a driving voltage line, is formed on the same layer as the source electrode S and the drain electrode D, and is connected thereto.

The data line DLa may be formed simultaneously (or concurrently) with the source electrode S and the drain electrode D and may be formed of the same material as the source electrode S and the drain electrode D. As a selective exemplary embodiment, the data line DL is formed of one or more metallic materials selected from the group consisting of Al, Pt, Pd, Ag, Mg, Au, Ni, Nd, Ir, Cr, Li, Ca, Mo, Ti, W, and Cu.

As a selective exemplary embodiment, the line insertion part H having a substantially uniform thickness in the downward direction may be formed in at least one of the upper surfaces of the gate insulating layer 210 and the interlayer insulating layer 230. A gate line GLa may be inserted into a first line insertion part H1a formed in the gate insulating layer 210, and the data line DLa may be inserted into a second line insertion part H2a formed in the interlayer insulating layer 230.

As a selective exemplary embodiment, the gate insulating layer 210 and the interlayer insulating layer 230 include inorganic films, and cracks propagating through the inorganic films may be blocked by the first line insertion part H1a and the second line insertion part H2a.

Figure 3:
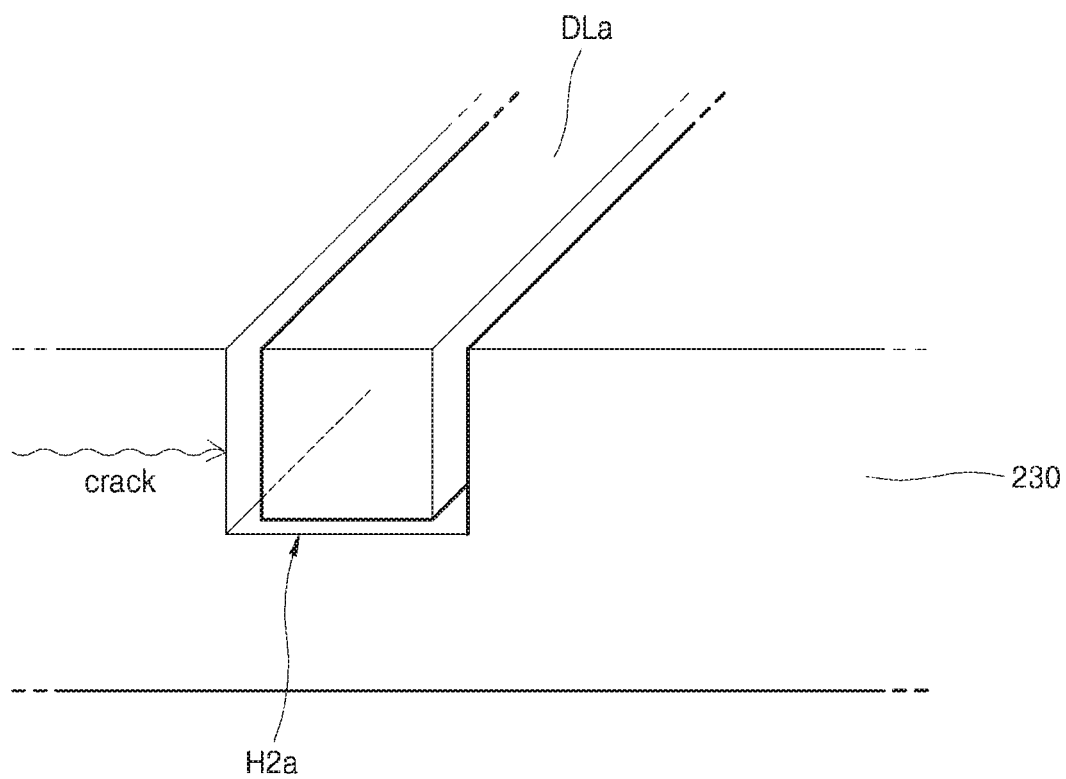
FIG. 3 is a schematic perspective view of an interlayer insulating layer, on which a second line insertion part is formed, and a data line according to an exemplary embodiment.
Figure 4A:
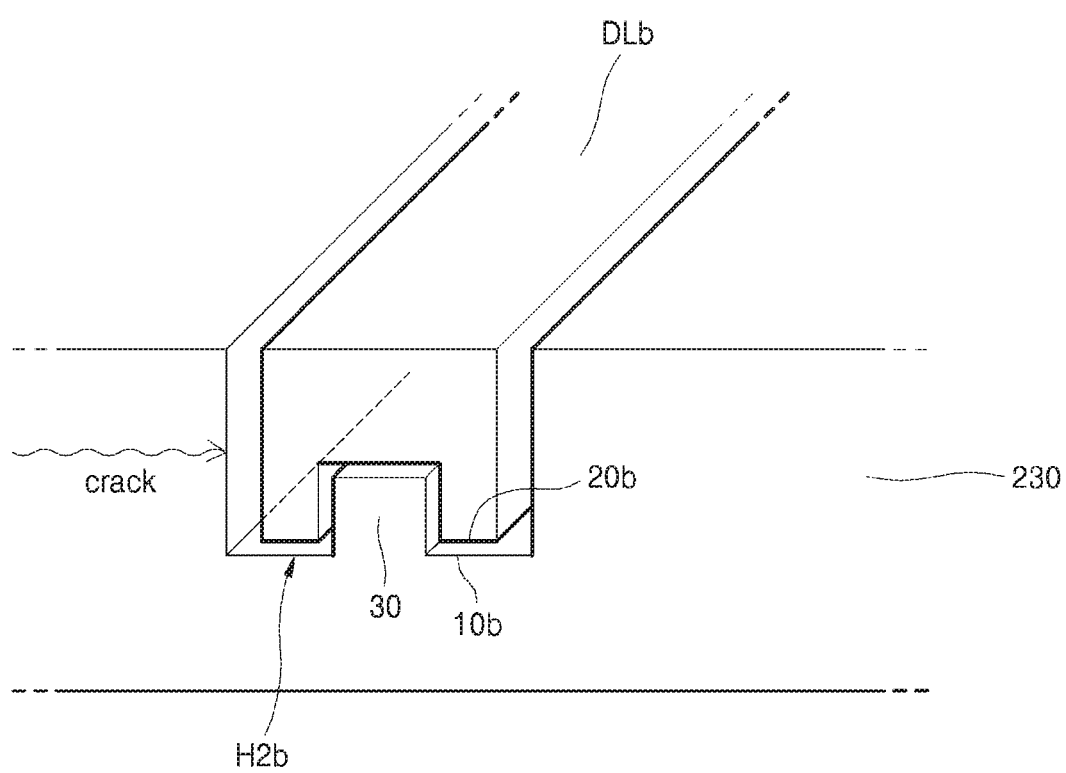
FIG. 4A is a schematic perspective view of an interlayer insulating layer, on which a second line insertion part is formed, and a data line according to another exemplary embodiment.
Figure 4B:
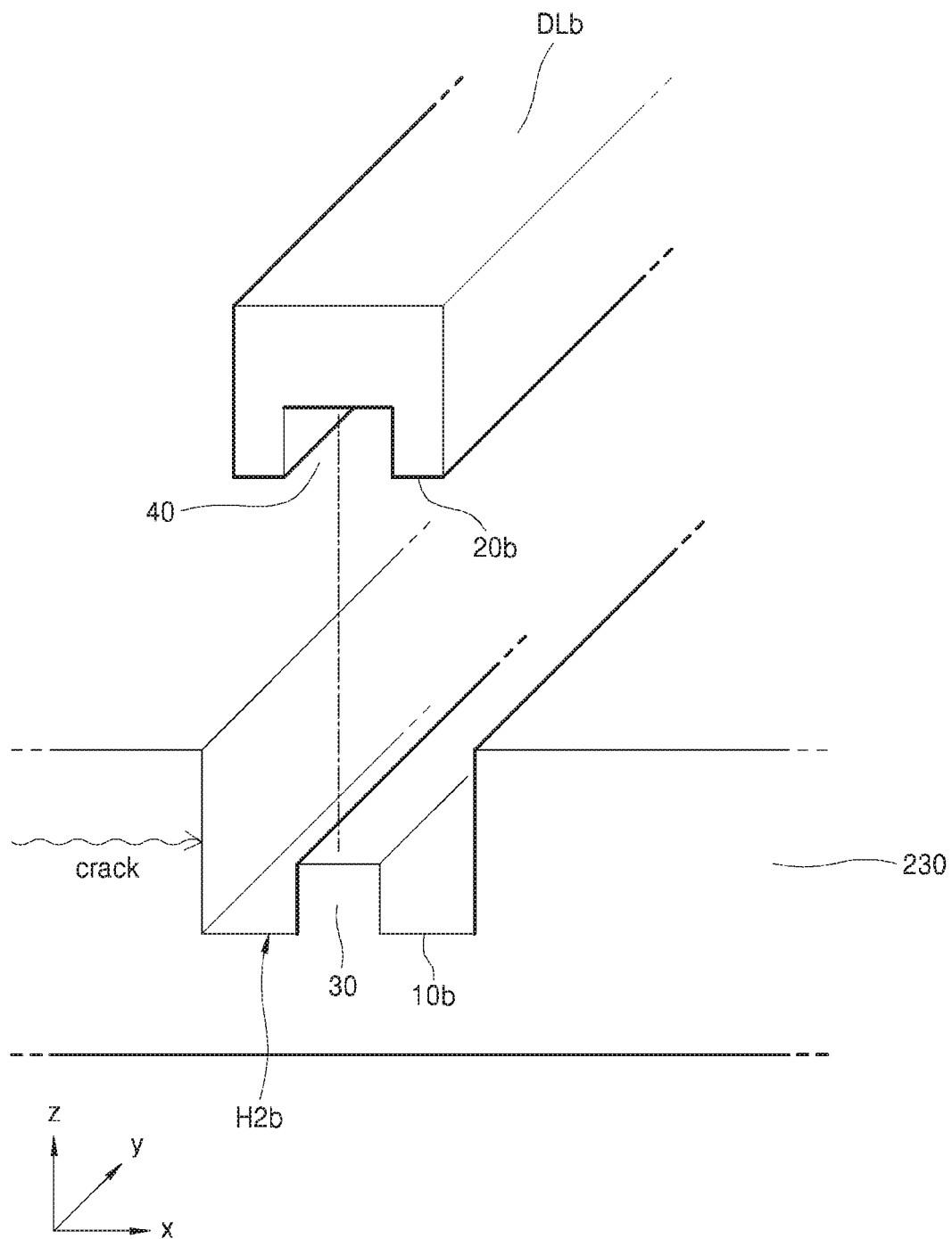
FIG. 4B is a perspective view of the interlayer insulating layer and data line of FIG. 4A.
Figure 5:
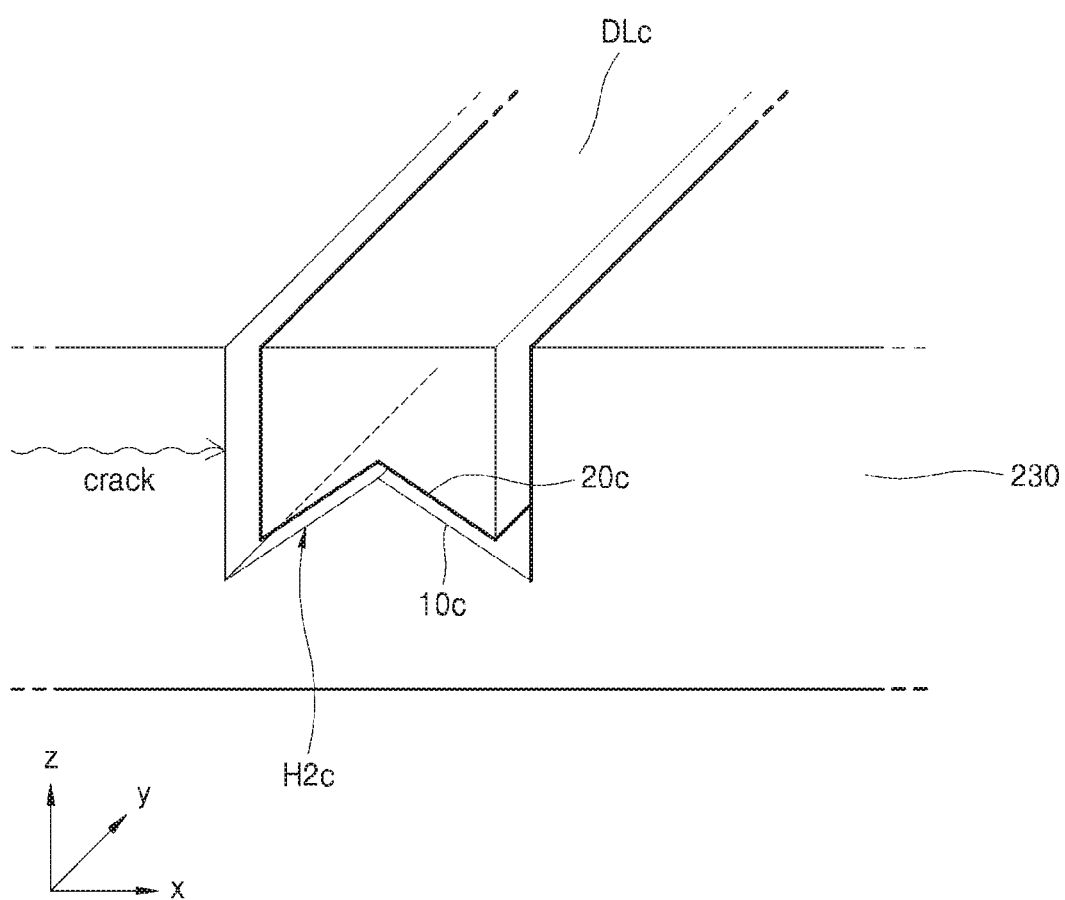
FIG. 5 is a schematic perspective view of an interlayer insulating layer, on which a second line insertion part is formed, and a data line according to another exemplary embodiment.

FIGS. 3 to 5 are schematic perspective views illustrating an enlarged insulating film in which line insertion parts H of various shapes are formed and an enlarged line.

FIGS. 3 to 5 show an interlayer insulating layer 230 in which data lines DLa, DLb, and DLc and second line insertion parts H2a, H2b, and H2c are formed, but the described technology is not limited thereto. The same exemplary embodiment may be applied to the gate insulating layer 210 in which the gate line GL and the first line insertion part H1 are formed.

Hereinafter, the descriptions that are already provided will not be repeated for convenience, and the data lines DLa, DLb, and DLc, the second line insertion parts H2a, H2b, and H2c, and the interlayer insulating layer 230 will be described.

FIG. 3 is a schematic perspective view of the interlayer insulating layer 230, on which the second line insertion part H2a is formed, and the data line DLa according to an exemplary embodiment.

The second line insertion part H2a may extend in a lengthwise direction (y) of the data line DLa because the data line DLa has to be inserted into the second line insertion part H2a.

Also, the second line insertion part H2a may have a certain depth in a thickness direction (z) of the interlayer insulating layer 230. The depth of the second line insertion part H2a in a z direction of the second line insertion part H2a is not greater than a thickness of the interlayer insulating layer 230 and may be less than a thickness of the interlayer insulating layer 230.

As a selective exemplary embodiment, the second line insertion part H2a is shaped as a rectangular parallelepiped, as shown in FIG. 3.

That is, the second line insertion part H2a may be shaped as a rectangular parallelepiped having a certain height in a lengthwise direction (y) of the data line DLa, a uniform vertical length of a base side in a thickness direction (z) of the interlayer insulating layer 230, and a uniform horizontal length of the base side in a direction (x) perpendicular to the thickness direction (z).

Accordingly, as a selective exemplary embodiment, the data line DLa inserted into the second line insertion part H2a may also be shaped as a rectangular parallelepiped.

As a selective exemplary embodiment, the first line insertion part H1 and the gate line GL may have the same shape as the second line insertion part H2a and the data line DLa. That is, the first line insertion part H1 and the gate line GL may also be shaped as a rectangular parallelepiped extending in the y direction.

However, the described technology is not limited thereto, and shapes of the first line insertion part H1 and the gate line GL may be different from shapes of the second line insertion part H2a and the data line DLa.

FIG. 4A is a schematic perspective view of the interlayer insulating layer 230, on which the second line insertion part H2b is formed, and the data line DLb according to another exemplary embodiment. FIG. 4B is a perspective view of the second line insertion part H2b and the data line DLb of FIG. 4A.

The second line insertion part H2b may extend in the lengthwise direction (y) of the data line DLb because the data line DLb needs to be inserted into the second line insertion part H2b.

Also, the second line insertion part H2b may have a certain length in the thickness direction (z) of the interlayer insulating layer 230b. The length of the second line insertion part H2b in the z direction is not greater than the thickness of the interlayer insulating layer 230b and may be within the thickness of the interlayer insulating layer 230b.

As a selective exemplary embodiment, the second line insertion part H2b has a protrusion 30 on a base side 10b.

That is, as shown in FIG. 4A, the second line insertion part H2b having a rectangular parallelepiped shape is formed, and the protrusion 30 may be formed on the base side 10b of the second line insertion part H2b that has a rectangular parallelepiped shape.

Accordingly, as a selective exemplary embodiment, the data line DLb that is inserted into the second line insertion part H2b has a rectangular parallelepiped shape, and a groove 40 may be formed in a base side 20b.

That is, the data line DLb may be inserted into the second line insertion part H2b while the protrusion 30 formed on the base side 10b of the second line insertion part H2b interlocks with the groove 40 formed in the base side 20b of the data line DLb.

Accordingly, the data line DLb may be firmly fixed and inserted into the second line insertion part H2b. Also, the cracks propagating through the interlayer insulating layer 230 may be blocked by the second line insertion part H2b.

As a selective exemplary embodiment, the first line insertion part H1 and the gate line GL have the same shape as the second line insertion part H2b and the data line DLb, as shown in FIG. 4B. That is, the first line insertion part H1 may have a shape of a rectangular parallelepiped having a protrusion on its base side and may have a shape of a rectangular parallelepiped having a groove on a base side of the gate line GL.

The described technology is not limited thereto, and the shapes of the first line insertion part H1 and the gate line GL may be different from the shapes of the second line insertion part H2b and the data line DLb.

FIG. 5 is a schematic perspective view of the interlayer insulating layer 230, on which a second line insertion part H2c is formed, and a data line DLc according to another exemplary embodiment.

The second line insertion part H2c may extend in a lengthwise direction (y) of the data line DLc because the data line DLc has to be inserted into the second line insertion part H2c.

Also, the second line insertion part H2c may have a certain thickness in a thickness direction (z) of the interlayer insulating layer 230. The length of the second line insertion part H2c in the z direction is not greater than the thickness of the interlayer insulating layer 230 and may be formed within the thickness of the interlayer insulating layer 230.

As a selective exemplary embodiment, the thickness of the second line insertion part H2c in the z direction is not uniform.

That is, as shown in FIG. 5, when a base side 10c of the second line insertion part H2c slants, a length of a center of the second line insertion part H2c in the z direction is the smallest, and lengths of both end portions of the second line insertion part H2c in the z direction may be the greatest.

As a selective exemplary embodiment, the second line insertion part H2c may slant such that a central portion of the base side 10c may protrude. That is, the base side 10c of the second line insertion part H2c may be shaped as ^. Accordingly, as a selective exemplary embodiment, a central portion of the base side 20c of the data line DLc that is inserted into the second line insertion part H2c may be dented such that the base side 20c of the data line DLc may correspond to the base side 10c of the second line insertion part H2c.

Therefore, the base side 20c of the data line DLc, of which the central portion is dented, interlocks with the base side 10c of the second line insertion part H2c, of which the central portion protrudes, and thus, the data line DLc may be inserted into the second line insertion part H2c.

Accordingly, the data line DLc may be firmly fixed and inserted into the second line insertion part H2c. Also, the cracks propagating through the interlayer insulating layer 230 may be blocked by the second line insertion part H2c.

As a selective exemplary embodiment, the first line insertion part H1 and the gate line GL may have the same shapes as the second line insertion part H2c and the data line DLc shown in FIG. 5. That is, a central portion of a base side of the first line insertion part H1 may protrude upward, and thus, the first line insertion part H1 may have a slant plane. A central portion of a base side of the gate line GL may be dented upward, and thus, the gate line GL may have a slant plane. Accordingly, the protruding portion of the first line insertion part H1 interlocks with the dented portion of the gate line GL, and thus, the gate line GL may be inserted into and fixed to the first line insertion part H1.

However, the inventive concept is not limited thereto, and the first line insertion part H1 and the gate line GL may have different shapes from the second line insertion part H2c and the data line DLc.

Figure 6B:
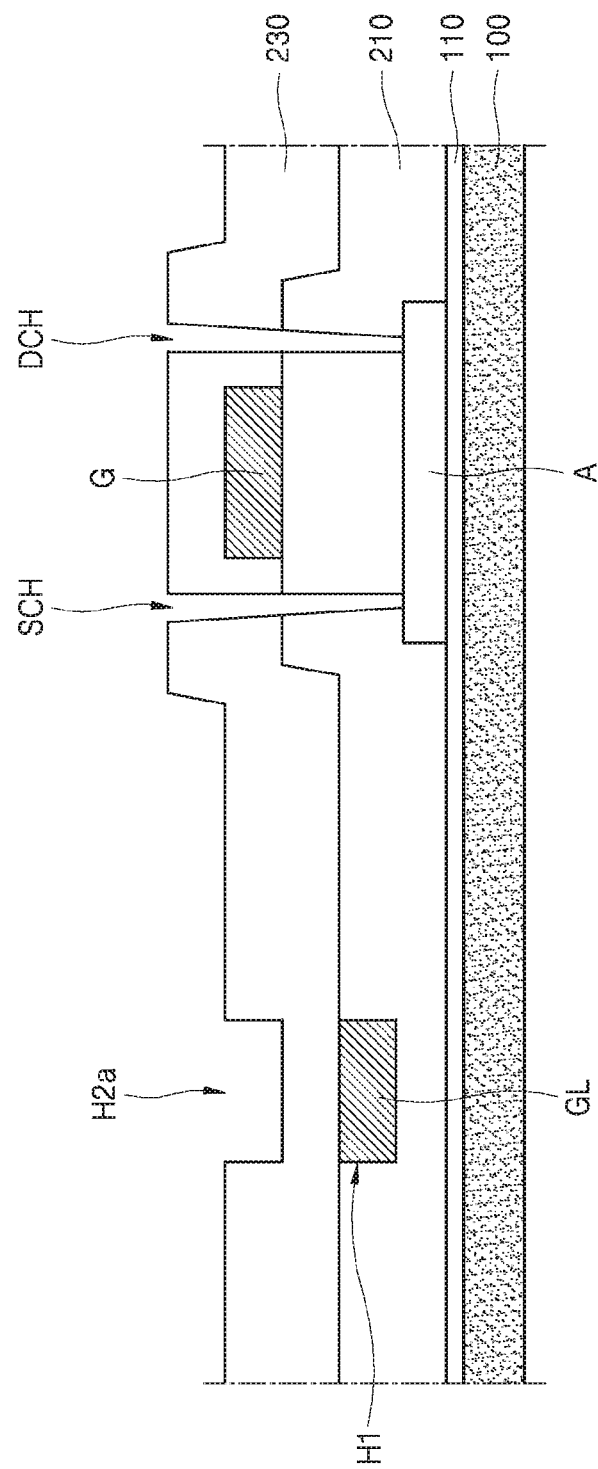
Figure 6C:
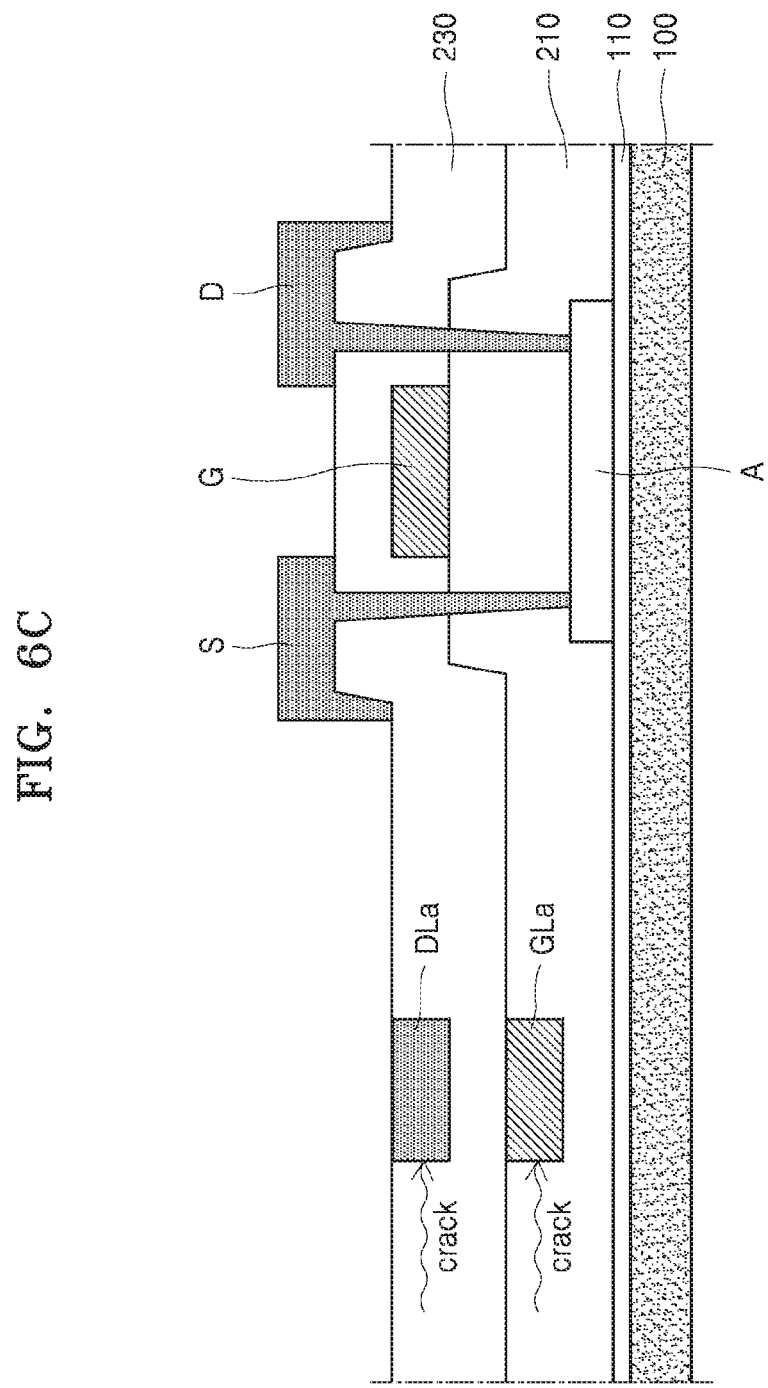

FIGS. 6A to 6C are cross-sectional views sequentially illustrating a method of manufacturing the flexible display device 1000 according to an exemplary embodiment. Like reference numerals in FIGS. 2 and 6A to 6C denote like elements, and for convenience, repeated descriptions thereof will be omitted.

The method of manufacturing the flexible display device 1000 of FIGS. 6A to 6C is a method of manufacturing the flexible display device 1000 of FIG. 2 and includes forming the first line insertion part H1 and the second line insertion part H2a. However, the described technology is not limited thereto.

That is, the method of manufacturing the flexible display device 1000 may include forming any one of the first line insertion part H1 and the second line insertion part H2a.

As shown in FIG. 6A, the buffer layer 110 may be formed on the substrate 100, and the thin film transistor TFT (refer to FIG. 2) may be formed on the buffer layer 110.

A semiconductor layer A may be formed on the buffer layer 110 as a semiconductor including amorphous silicon or crystalline silicon and may be deposited through various deposition methods. In this case, the crystalline silicon may be formed by crystallizing the amorphous silicon. A method of crystallizing the amorphous silicon may include a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. The semiconductor layer A may be patterned through a photolithography process.

The gate insulating layer 210 insulates the semiconductor layer A from the gate electrode G to be formed thereon and is formed on the entire substrate 100 by covering the semiconductor layer A. The gate insulating layer 210 may be formed through various deposition methods such as a chemical vapor deposition (CVD) method or a plasma-enhanced chemical vapor deposition (DECVD) method.

After the gate insulating layer 210 is formed, the first line insertion part H1 may be formed on the gate insulating layer 210 in a downward direction and have a certain thickness.

As shown in FIG. 6A, a cross-section of the first line insertion part H1 may be rectangular, but is not limited thereto. If the first line insertion part H1 may be inserted into the gate line GL, the first line insertion part H1 may have any shape.

The first line insertion part H1 may be formed by removing the gate insulating layer 210 through various etching methods such as dry etching, wet etching, or a combination thereof.

Referring to FIG. 6B, the gate electrode G may be formed on the gate insulating layer 210 in order to overlap at least a portion of the semiconductor layer A.

Also, the gate line GL including scan lines, light-emitting control lines, an initial voltage line, or the like may be simultaneously (or concurrently) formed with the gate electrode G. A shape of the gate line GL may correspond to that of the first line insertion part H1 such that the gate line GL may be inserted into the first line insertion part H1.

The interlayer insulating layer 230 is formed on the entire substrate 100 to cover the gate insulating layer 210 in which the gate electrode G and the gate line GL are inserted.

The interlayer insulating layer 230 may be formed through various deposition methods such as a CVD method and a PECVD method.

The second line insertion part H2a, a source electrode contact hole SCH, and a drain electrode contact hole DCH may be formed by removing the interlayer insulating layer 230.

The second line insertion part H2a may be formed on the interlayer insulating layer 230 and may have a certain thickness in a downward direction.

As shown in FIG. 6B, the second line insertion part H2a may be rectangular shaped, but is not limited thereto. If the data line DLa is inserted into the second line insertion part H2a, the second line insertion part H2a may have any shape.

As a selective exemplary embodiment, the second line insertion part H2a has the same shape as the first line insertion part H1 or may have different shape therefrom.

The second line insertion part H2a, the source electrode contact hole SCH, the drain electrode contact hole DCH may be formed by removing the interlayer insulating layer 230 through various etching methods such as dry etching, wet etching, and a combination thereof.

Referring to FIG. 6C, the source electrode S and the drain electrode D may be formed on the interlayer insulating layer 230 so as to overlap at least a portion of the source electrode contact hole SCH and the drain electrode contact hole DCH.

Also, the data line DLa including a driving voltage line, etc. may be formed simultaneously (or concurrently) with the source electrode S and the drain electrode D. The data line DLa may correspond to the second line insertion part H2a such that the data line DLa may be inserted into the second line insertion part H2a.

The first line insertion part H1 and the second line insertion part H2a are respectively formed on the gate insulating layer 210 and the interlayer insulating layer 230 as grooves having certain thicknesses, and thus, cracks, which are easily generated in both ends of the first line insertion part H1 and the second line insertion part H2a due to external impact after glass is removed, may be prevented from propagating through the gate insulating layer 210 and the interlayer insulating layer 230.

FIGS. 6A to 6C show the flexible display device 1000 including both the first line insertion part H1 and the second line insertion part H2a, but the described technology is not limited thereto. Although the line insertion part H of any one of the first line insertion part H1 and the second line insertion part H2a is formed, the cracks generated due to external impact may be easily prevented from propagating.

According to at least one of the disclosed embodiments, propagation of cracks, which are easily generated due to small impact after a glass substrate is removed during the manufacture of a flexible display device, may be blocked.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the drawings, it will be understood by those of ordinary skill in the art that various changes in form and details may be made therein without departing from the spirit and scope as defined by the following claims.

What is claimed is:

1. A flexible display comprising:
a substrate;
a gate insulating layer formed over the substrate;
an interlayer insulating layer formed over the gate insulating layer; and
a trench disposed between the gate insulating layer and the interlayer insulating layer and configured to accommodate a signal line therein,
wherein the trench has a protrusion protruding towards the signal line.

2. The flexible display of claim 1, wherein the trench extends in a lengthwise direction of a gate line or a data line.

3. The flexible display of claim 2, wherein the trench has a thickness less than that of the gate insulating layer or the interlayer insulating layer in a thickness direction of the gate insulating layer or the interlayer insulating layer.

4. The flexible display of claim 1, wherein the trench has a rectangular parallelepiped shape having a height in a lengthwise direction of a gate line or data line, a vertical length of a base side in a thickness direction of the gate insulating layer or the interlayer insulating layer, and a horizontal length of the base side in a widthwise direction crossing the lengthwise direction.

5. The flexible display of claim 1, further comprising:
a thin film transistor (TFT) comprising a gate electrode formed over the gate insulating layer and source and drain electrodes formed over the interlayer insulating layer, wherein the TFT is formed over the substrate; and
an organic light-emitting device (OLED) formed over the TFT.

6. The flexible display of claim 5, wherein the trench comprises a first trench formed in the gate insulating layer, and wherein the flexible display further comprises a gate line formed on the same layer as the gate electrode and inserted into the first trench.

7. The flexible display of claim 6, wherein the gate line comprises a plurality of scan lines, a plurality of emission control lines, and an initial voltage line.

8. The flexible display of claim 5, wherein the trench comprises a second trench formed in the interlayer insulating layer, and wherein the flexible display further comprises a data line formed on the same layer as the source and drain electrodes and inserted into the trench.

9. The flexible display of claim 8, wherein the data line comprises a driving voltage line.

10. The flexible display of claim 1, wherein the trench is configured to block a plurality of cracks, generated in end portions the flexible display due to external impact, from propagating beyond the gate insulating layer or the interlayer insulating layer.

11. The flexible display of claim 1, wherein the trench has a rectangular parallelepiped shape, and wherein the signal line is a gate line or a data line.

12. The flexible display of claim 11, wherein the data line or gate line inserted into the trench has a groove on a base side of the data line or gate line, and wherein the groove interlocks with the protrusion.

13. The flexible display of claim 12, wherein the protrusion has a rectangular shape.

14. The flexible display of claim 12, wherein the protrusion has a triangular shape.

15. A flexible display comprising:
a substrate;
a gate insulating layer formed over the substrate;
an interlayer insulating layer formed over the gate insulating layer;
a trench formed in at least one of an upper portion of the gate insulating layer and an upper portion of interlayer insulating layer and configured to accommodate a signal line therein; and
a thin film transistor (TFT) comprising a gate electrode formed over the gate insulating layer and source and drain electrodes formed over the interlayer insulating layer, wherein the TFT is formed over the substrate.

16. The flexible display of claim 15, wherein the trench comprises a first trench formed in the gate insulating layer, and wherein the flexible display further comprises a gate line formed on the same layer as the gate electrode and inserted into the first trench.

17. The flexible display of claim 15, wherein the trench comprises a second trench formed in the interlayer insulating layer, and wherein the flexible display further comprises a data line formed on the same layer as the source and drain electrodes and inserted into the second trench.

18. The flexible display of claim 15, wherein the signal line comprises a driving voltage line.

19. The flexible display of claim 15, wherein the trench has a protrusion protruding towards the signal line.

* * * * *